United States Patent [19]

Kinoshita

[11] Patent Number: 4,600,995
[45] Date of Patent: Jul. 15, 1986

[54] METHOD FOR MANUFACTURING A CUSTOM-CIRCUIT LSI, AND A GATE ARRAY DEVICE

[75] Inventor: Tsuneo Kinoshita, Tokyo, Japan

[73] Assignee: Tokyo Shibaura Denki Kabushiki Kaisha, Kawasaki, Japan

[21] Appl. No.: 565,001

[22] Filed: Dec. 23, 1983

[30] Foreign Application Priority Data

Dec. 27, 1982 [JP] Japan .................................. 57-226969

[51] Int. Cl.$^4$ ............................................. G06F 15/46
[52] U.S. Cl. ..................... 364/491; 307/303; 364/300
[58] Field of Search ................................ 364/488–491, 364/300; 307/303, 29; 29/846

[56] References Cited

U.S. PATENT DOCUMENTS

| | | | |
|---|---|---|---|
| 3,968,478 | 7/1976 | Mensch, Jr. ........................ | 307/303 |
| 4,377,849 | 3/1983 | Finger et al. ...................... | 307/303 |
| 4,431,928 | 2/1984 | Skokan ............................... | 307/303 |

OTHER PUBLICATIONS

Joseph D. Greenfield, "Practical Digital Design Using IC's," pp. 132–142, 483–484, 1977.
Stephen Trimberger, "Automating Chip Layout," IEEE 1982, Spectrum, vol. 19, No. 6.

*Primary Examiner*—Edward J. Wise
*Attorney, Agent, or Firm*—Cushman, Darby and Cushman

[57] ABSTRACT

A gate array is used as the base component of a custom-circuit LSI. A number of logic cells are arranged in the form of a matrix in the first area of the gate array. These logic cells are interconnected by a metal pattern or patterns to build a custom-circuit. Driver cells for energizing the output and input signals of the custom-circuit are formed in the second area of the gate array. Bonding pads, which will be used as the input/output terminals of the custom-circuit, are formed in the third area of the gate array.

18 Claims, 6 Drawing Figures

F I G. 1
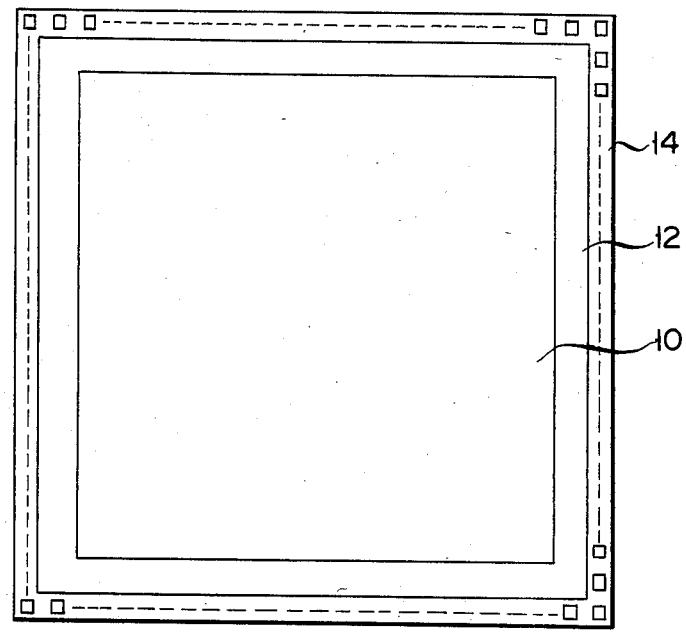
F I G. 2
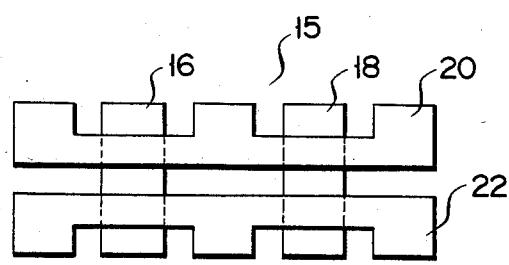
F I G. 3
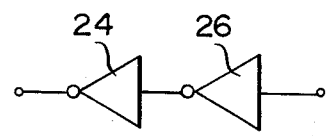

METHOD FOR MANUFACTURING A CUSTOM-CIRCUIT LSI, AND A GATE ARRAY DEVICE

BACKGROUND OF THE INVENTION

The present invention relates to a method for manufacturing a custom-circuit LSI, and a gate array device used as the base component of a custom-circuit LSI.

More and more gate array devices are used as LSIs of various types come into use in various apparatus. These gate arrays are, so to speak, semi-custom LSI devices. Their logic architectures are determined by lay-out masks used at the final stage of manufacture. A gate array device comprises a semiconductor chip and a number of logic cells (e.g., 2-input NAND gates, 2-input NOR gates) arranged in matrix on the chip. The logic cells are to be interconnected so as to perform a custom-circuit logic function. The user-designer first designs a custom-circuit LSI to be made in the form of an IC, then selects one of the commercially available gate array chips, which has the number of logic cells corresponding to the scale of the custom-circuit, and finally designs a metal pattern for interconnecting these logic cells, in accordance with the logic architecture of the custom-circuit. To simulate the interconnection of the logic cells, the user-designer uses a computer aided design (CAD) system. This system helps him design the metal pattern within a short time.

If a large-scale custom-cicuit LSI is manufactured, the apparatus with this LSI will be more reliable, smaller and less expensive than otherwise. It is therefore desired at present that an gate array device have a higher packing density.

Some problems arise when a gate array having about 6000 or more logic cells is used. As mentioned above, a CAD system is indispensable in shortening the time necessary for designing custom-circuit LSIs. The existing CAD system, however, can by itself design a practical metal pattern which can interconnect about 2000 logic cells or less. To design a metal pattern for interconnecting 6000 cells or more, the human designer has to repeat the designing procedure many times. After all, many hours will be inevitably spent to provide a metal pattern which connects 6000 or more logic cells.

Indeed the user-designer can develop custom-circuit LSIs of different functions if he uses such gate arrays as base components. However, he cannot design a large-scale logic circuit without making a considerable mistake. Further, the number of gates incorporated in the custom-circuit LSI he designed may not be equal to the number of logic cells which must be build in the gate array of the LSI, depending on the fashion in which the neighboring logic cells are interconnected. That is, some of the logic cells of the array cannot be connected directly to each other, and extra logic cells must be provided to connect these specific logic cells. The larger scale the custom-circuit LSI has, the more difficult it will be for the user-designer to determine how many logic cells should be included in the gate array. As a result, it is hard for him to select a proper gate array and not to leave many logic cells useless.

SUMMARY OF THE INVENTION

The object of the present invention is to provide a method for manufacturing a large-scale custom-circuit LSI, whose metal pattern can be designed with a CAD system in a short time, thus reducing labor, and to provide a gate array deivce which is used as the base component of such a custom-circuit LSI.

According to the invention, there is provided a method comprising a first step of preparing a gate array device comprising a number of logic cells; a second step of dividing the logic cells formed of the gate array device into a plurality of groups each including a predetermined number of logic cells; a third step of interconnecting the logic cells of each group, thus forming at least one logic circuit; and a fourth step of interconnecting the logic cells of the groups.

Further, according to the present invention there is provided a gate array device comprising a semiconductor chip; a plurality of groups of logic cells formed on the semiconductor chip, the logic cells of each group being adapted to be interconnected to form at least one logic circuit; a plurality of buffer circuits formed on the semiconductor chip for reducing the delay of signal transfer between logic circuits to be formed by interconnecting the logic cells and to be connected to one another to form a custom-circuit; and bonding pads formed on the semiconductor chip for receiving input and output signals of the custom-circuit.

BRIEF DESCRIPTION OF THE DRAWINGS

FIG. 1 is a plan view of a gate array used as a base component of a custom-circuit LSI manufactured by a method according to the present invention;

FIG. 2 is a plan view of one of the NAND gates used as logic cells in the gate array shown in FIG. 1;

FIG. 3 is a circuit diagram showing one of the driving cells of the gate array illustrated in FIG. 1;

DETAILED DESCRIPTION OF THE PREFERRED EMBODIMENTS

Figure 4:
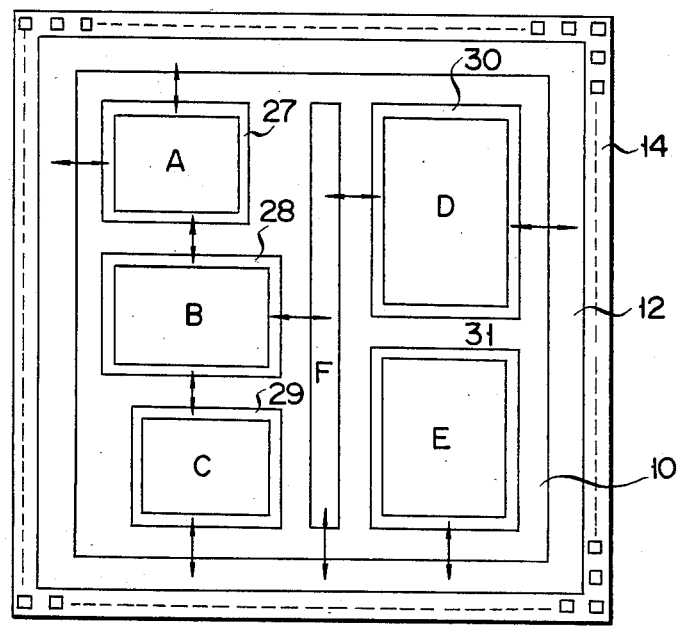
FIG. 4 is a plan view of the gate array with logic circuits formed in it.

A method for manufacturing a custom-circuit LSI, i.e., an embodiment of the invention, will be described. FIG. 1 shows a gate array which is the base component of the custom-circuit LSI. This gate array has 10,000 logic cells (not shown) in area 10. These logic cells are arranged in the form of a matrix. They may be interconnected by a metal pattern to form a custom-circuit. In another area 12 of the gate array, driver cells (not shown) are disposed to energize the input and output signals of the custom-circuit. In still another area 14 of the gate array, bonding pads are arranged to function as the input/output terminals of the custom-circuit.

Each of the logic cells, which are provided in the area 10, forms a NAND gate 15 as shown in FIG. 2. The NAND gate 15 includes a p-type semiconductor layer 16, an n-type semiconductor layer 18, an isolation layer (not shown), and two conductive layers 20 and 22. The isolation layer is formed on the layers 16, 18. The conductive layer 20 is formed on the isolation layer and above the p- and n-type layers 16, 18. The conductive layer 22 is formed on the isolation layer and above the p- and n-type semiconductor layers 16, 18. Four transistors are formed in those regions where the layers 16, 18 intersect with the layers 20, 22. Each driver cell includes two inverters 24 and 26 which are connected in series as shown in FIG. 3. Its power capacity is greater than that of the logic cells arranged in the area 10. The driver cells can be connected to the logic cells provided in the area 10 and the bonding pads arranged in the area 14.

Assume that the CAD system in common use is employed to design the metal pattern of the custom-circuit LSI. The CAD system can efficiently simulate the interconnection of 2000 logic cells at most. When the gate array is used to form a custom-circuit having 6000 gates or more gates, the custom-circuit is divided into smaller functioning blocks, so that the metal pattern for each block may be simulated by the CAD system. The gate array of FIG. 1 has an appropriate number of logic cells to form, for example, five logic circuits A-E which have 1K, 2K, 1K, 2K and 2K NAND gates ($K=10^3$) and a logic circuit F for inspecting the custom-circuit LSI for defects, e.g., an LSSD circuit.

More specifically, as shown in FIG. 4, the logic cells provided in the area 10 are divided into groups which correspond to the logic circuits A-F. Each of the groups corresponding to the logic circuits A-E includes extra logic cells which will form buffers for reducing the delay of signal transfer between the circuits A-E. These buffers constitute the peripheral regions 27-31 of the logic circuits A-E. Each of these buffers is a unidirectional buffer having inverters 32 and 34 connected in parallel to output signals in the same direction. Alternatively, it may be a bi-directional buffer including inverters 36 and 37 connected in parallel, thus forming a first parallel circuit, and inverters 38 and 39 connected in parallel, thus forming a second parallel circuit; these first and second circuits are connected in parallel to each other to output signals in opposite directions.

The metal patterns for the six groups of logic cells are designed in accordance with the architectures of the logic circuits A-F. The CAD system automatically lays out 90% or more of the interconnection between the logic cells of each group. The user-designer operates the CAD system to connect the logic cells which the CAD system fails to interconnect, using extra logic cells. In this way, six metal patterns are simulated. The patterns thus simulated are copied onto mask films. Using these mask films, metal patterns are formed in the area 10. The metal patterns interconnect the logic cells of the six groups, thus forming the logic circuits A-F. Of these circuits, circuits A-E have input buffers and output buffers.

Furthermore, the CAD system is used to design a metal pattern for connecting the logic circuits A-F. Buffers are used to connect the circuits A-F. If the CAD system fails to automatically design the metal pattern, the user-designer operates the system to design the pattern that cannot be automatically designed. The pattern thus designed is copied onto a mask film. Using this mask film, a metal pattern is formed in the area 10 of the gate array. The logic circuits A-F are thereby interconnected to have a custom-circuit logic function. Then, some of the logic cells forming the logic circuits A-F may be connected to the bonding pads in the area 14 by the driver cells arranged in the area 12.

When the metal patterns are formed and the logic circuits A-F are connected to the bonding pads by the driver cells, a custom-circuit LSI is formed on the gate array chip.

In the method described above, a plurality of small-scale logic circuits A-F, which are combined to form a custom-circuit LSI, are built in the gate array. This makes it not only easy for the user-designer to design the individual logic circuits A-F but also possible for him to predict the number of logic cells which are necessary to form the logic circuits A-F on the gate array chip. As mentioned above, the logic cells formed on the gate array chip are divided into groups each having 2000 gates or less. Further, the logic cells of each group are interconnected by a metal pattern designed in accordance with the logic architecture of the circuit they constitute, and the circuits A-F thus formed are interconnected by a metal pattern designed in accordance with the logic architecture of the custom-circuit LSI they constitute. Hence, the ordinary CAD system can be used to design the metal patterns in a short time. It follows that the number of logic cells the interconnection of which cannot be simulated by the CAD system is very small, thereby saving many man-hours.

In the embodiment, a plurality of buffers are incorporated in each of the logic circuits A-E so that signals may be transferred between these circuits quickly. The logic circuit F of a level sensitive scan design (LSSD), which is connected to the logic circuits A-E, makes it easy to inspect the resultant custom-circuit LSI for defects.

Figure 5:
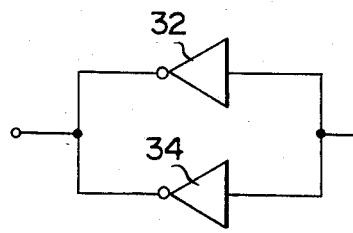
FIG. 5 is a circuit diagram of a uni-directional buffer which may be provided in each of the logic circuits shown in FIG. 4.
Figure 6:
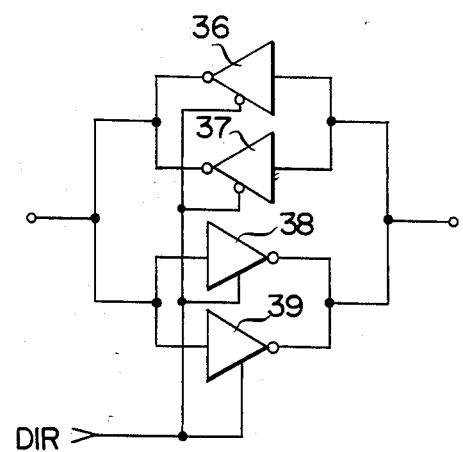
FIG. 6 is a circuit diagram of a bi-directional buffer which may be provided in each of the logic circuits shown in FIG. 4.

In the method, a plurality of mask films are used to form metal patterns on the gate array chip. In other words, a mask film is laid on the chip every time one metal is formed. Instead, a single mask film on which a plurality of patterns have been copied may be used to form metal patterns at the same time. Moreover, the method may also be applied to such gate array devices which have, as shown in FIGS. 5 and 6, buffers formed in the area 10 (FIG. 1) together with a number of logic cells.

As described above, the method and gate array device according to the present invention allow for use of the ordinary CAD system in designing a custom-circuit LSI though the gate array device has 2000 logic cells or more, thus saving many man-hours which would be required if the CAD system could not be employed. In other words, the present invention enables the existing CAD system to design a custom-circuit LSI with high efficiency. Accordingly, the invention helps the user-designers to cope with the recent trend of increasing the packing density of LSI devices.

What is claimed is:

1. A method for manufacturing a custom-circuit LSI, comprising:
    a first step of preparing a mask-programmable logic array device on which a total number of logic cells are formed;
    a second step of interconnecting the logic cells formed in predetermined areas of the logic array device into a plurality of functional units, each including a predetermined number of interconnected logic cells which is less than the total number of logic cells and of a number that can be more easily manipulated by a CAD system; and
    a third step of interconnecting said functional units to form the custom-circuit.

2. A method according to claim 1, wherein said second step includes a sub-step of forming a buffer unit as one of the functional units.

3. A method according to claim 1, wherein said second step includes a sub-step of forming a buffer circuit in each functional unit.

4. A method according to claim 3, further comprising a fourth step of interconnecting those logic cells of said functional units which form said buffer circuits.

5. A method according to claim 1, wherein said second step includes a sub-step of forming a defect inspection unit to be used in inspecting the custom-circuit LSI for defects as one of the functional units.

6. A method according to claim 1, wherein said second step includes a sub-step of forming mask patterns for the interconnections of the logic cells in said predetermined areas, and includes a fourth step of forming a mask pattern for the interconnection of said functional units in said surface area.

7. A mask-programmable logic array device comprising:
   a semiconductor chip;
   a plurality of array sections which are formed on said semiconductor chip each including a plurality of logic cells which are interconnected to thereby form a functional unit in each said array section; and
   a plurality of buffer circuits means formed in areas surrounding said array sections, for coupling the functional units together as a custom-circuit.

8. A gate array device according to claim 7, wherein said buffer circuit includes a uni-directional buffer.

9. A gate array device according to claim 8, wherein said uni-directional buffer comprises a plurality of inverter circuits connected in parallel to output signals in the same direction.

10. A gate array device according to claim 7, wherein said buffer circuits include a bi-directional buffer.

11. A gate array device according to claim 10, wherein said bi-directional buffer comprises a first plurality of inverters connected in parallel forming a first parallel circuit, and a second plurality of inverters connected in parallel, thus forming a second parallel circuit, said first and second parallel circuits being connected in parallel to each other with inputs of said first plurality connected to outputs of said second plurality, and inputs of said second plurality connected to outputs of said first plurality, to thus output signals in opposite directions.

12. A gate array device according to claim 7, wherein said logic cells are NAND gates.

13. A gate array device according to claim 7, wherein said logic cells are NOR gates.

14. A mask-programmable logic array device according to claim 7, further comprising a plurality of bonding pads formed on said semiconductor chip, for receiving the input and output signals of said custom-circuit.

15. A gate array device according to claim 15, further comprising a plurality of driving cell means for energizing the input and output signals transferred between said bonding pads and the custom-circuit.

16. A mask-programmable logic array device, comprising:
   a semiconductor chip with:
   (a) a plurality of groupings of logic cells formed at predetermined areas of the surface area of the chip;
   (b) a plurality of buffer means for reducing signal transfer delay time, each said buffer means formed on said chip in peripheral regions surrounding said groupings of cells;
   (c) logic means formed on said chip for performing an operation in conjunction with at least one of said groupings of logic cells; and
   (d) bonding pad means, formed on said chip, for receiving and transmitting input and output signals;
   wherein said logic cells each said grouping are interconnected to form a functional unit, and the functional units are interconnected to form a custom-circuit.

17. A device as in claim 16 wherein each said group of logic array cells has a number of logic array cells which is within the range that can be operated upon a computer-aided drawing (CAD) system.

18. A device as in claim 17 wherein said number of logic array cells is less than or equal to 2,000.

* * * * *